(12) United States Patent
Anderson et al.

(10) Patent No.: US 7,659,155 B2
(45) Date of Patent: Feb. 9, 2010

(54) METHOD OF FORMING A TRANSISTOR HAVING GATE AND BODY IN DIRECT SELF-ALIGNED CONTACT

(75) Inventors: Brent A. Anderson, Jericho, VT (US); Andres Bryant, Burlington, VT (US); William F. Clark, Jr., Essex Junction, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 4 days.

(21) Appl. No.: 11/683,470

(22) Filed: Mar. 8, 2007

(65) Prior Publication Data

US 2008/0217707 A1    Sep. 11, 2008

(51) Int. Cl.
*H01L 29/78* (2006.01)
(52) U.S. Cl. .............. 438/180; 257/330; 257/E29.263
(58) Field of Classification Search .............. 257/69, 257/204, 282, 330, 332, 346, 347, 350, 351, 257/387, E21.433, E21.632, E27.064, E27.108, 257/368, 386, E21.453, E21.454, E29.263, 257/244, 283, E21.444; 438/149, 151, 155, 438/180, 182–184, 197, 199, 229, 299, 311, 438/926, 230
See application file for complete search history.

(56) References Cited

U.S. PATENT DOCUMENTS

| 5,405,795 | A | 4/1995 | Beyer et al. |
|---|---|---|---|
| 6,177,708 | B1 | 1/2001 | Kuang et al. |
| 6,204,532 | B1 | 3/2001 | Gambino et al. |
| 6,300,657 | B1 | 10/2001 | Bryant et al. |
| 6,537,861 | B1 | 3/2003 | Kroell et al. |
| 6,624,475 | B2 | 9/2003 | Bryant et al. |
| 6,664,592 | B2 * | 12/2003 | Inumiya et al. ............. 257/330 |
| 6,845,198 | B2 | 1/2005 | Montgomery et al. |
| 7,091,069 | B2 * | 8/2006 | Doris et al. ................. 438/149 |
| 2003/0125925 | A1 | 7/2003 | Walther et al. |
| 2007/0152266 | A1 * | 7/2007 | Doyle et al. ................ 257/327 |
| 2007/0157140 | A1 | 7/2007 | Holesovsky et al. |

OTHER PUBLICATIONS

U.S. Appl. No. 11/935,612, Office Action dated Jun. 25, 2009.

* cited by examiner

*Primary Examiner*—David Vu
*Assistant Examiner*—Suberr Chi
(74) *Attorney, Agent, or Firm*—Anthony J. Canale; Hoffman Warnick LLC

(57) ABSTRACT

A transistor having a directly contacting gate and body and related methods are disclosed. In one embodiment, the transistor includes a gate; a body; and a dielectric layer extending over the body to insulate the gate from the body along an entire surface of the body except along a portion of at least a sidewall of the body, wherein the gate is in direct contact with the body at the portion. One method may include providing the body; forming a sacrificial layer that contacts at least a portion of a sidewall of the body; forming a dielectric layer about the body except at the at least a portion; removing the sacrificial layer; and forming the gate about the body such that the gate contacts the at least a portion of the sidewall of the body.

6 Claims, 7 Drawing Sheets

METHOD OF FORMING A TRANSISTOR HAVING GATE AND BODY IN DIRECT SELF-ALIGNED CONTACT

BACKGROUND OF THE INVENTION

1. Technical Field

The invention relates generally to integrated circuit (IC) chip fabrication, and more particularly, to a transistor having a directly contacting gate and body and related methods.

2. Background Art

In the integrated circuit (IC) chip fabrication industry there are a number of devices in which tying the gate to the body is advantageous. One illustrative device in which this structure is advantageous is a dynamic threshold complementary metal-oxide semiconductor (DTCMOS) device. DTCMOS devices have the advantage of producing sub-threshold voltage slopes steeper than KT/q, where K is Boltzmann's constant, T is the temperature and q is the fundamental unit of charge. While the gate to body contacts are usually resistance-capacitance (RC) limited for super-threshold voltage applications, they are better suited for sub-threshold voltage circuits, which is due, in part, to their slower operating speed of sub-threshold voltage logic, and the ability to optimize RC for the low capacitance and high resistance situation. Unfortunately, typical contacts tying gates and bodies together require a variety of wiring and are not self-aligned. As a result, they are difficult to generate and take up more space on the circuit.

SUMMARY OF THE INVENTION

A transistor having a directly contacting gate and body and related methods are disclosed. In one embodiment, the transistor includes a gate; a body; and a dielectric layer extending over the body to insulate the gate from the body along an entire surface of the body except along at least a portion of a sidewall of the body, wherein the gate is in direct contact with the body at the portion. One method may include providing the body; forming a sacrificial layer that contacts at least a portion of a sidewall of the body; forming a dielectric layer about the body except at the at least a portion; removing the sacrificial layer; and forming the gate about the body such that the gate contacts the at least a portion of the sidewall of the body.

A first aspect of the invention provides a transistor comprising: a gate; a body; and a dielectric layer extending over the body to insulate the gate from the body along an entire surface of the body except along at least a portion of a sidewall of the body, wherein the gate is in direct contact with the body at the portion.

A second aspect of the invention provides a method of forming a contact between a gate and a body thereof, the method comprising: providing the body; forming a sacrificial layer that contacts at least a portion of a sidewall of the body; forming a dielectric layer about the body except at the at least a portion; removing the sacrificial layer; and forming the gate about the body such that the gate contacts the at least a portion of the sidewall of the body.

A third aspect of the invention provides a method of forming a contact to a body of a gate, the method comprising: providing the body; forming a sacrificial layer that contacts at least a portion of a sidewall of the body to block a sidewall body contact region; forming a dielectric layer about the body except at the at least a portion; removing the sacrificial layer; and forming a self-aligned gate contact to the body by forming the gate about the body such that the gate contacts the sidewall body contact region.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIGS. 13 and 14 also show a transistor according to one embodiment.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
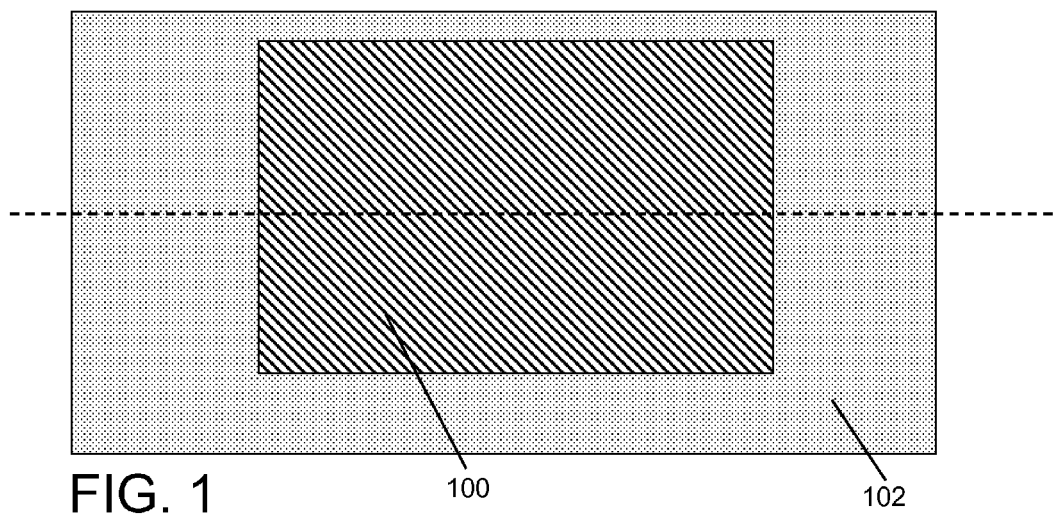
FIGS. 1-14 show one embodiment of a method of forming a contact between a gate and a body. In the figures, the odd number figures show top views of an associated even number figure, each of which show a cross-sectional view.
Figure 2:
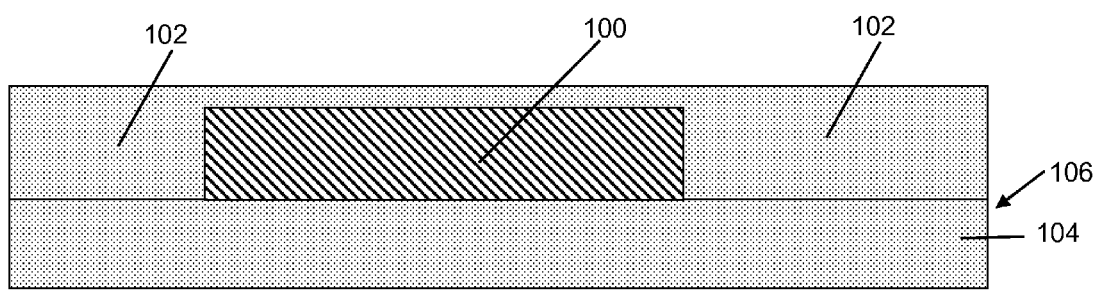

Turning to the drawings, one embodiment of a method of forming contact between a gate and a body thereof is shown. In FIGS. 1 and 2, a body 100 is provided, i.e., an active area of a transistor. Body 100 is illustrated positioned between isolation regions 102 (e.g., shallow trench isolations (STI) of silicon oxide) atop a buried insulator layer 104 of a semiconductor-on-insulator (SOI) substrate 106 (substrate layer not shown). However, the teachings of the invention are not limited to this type substrate. Body 100 may be formed using any now known or later developed techniques, and may include any common body material such as silicon or doped silicon. Note, FIG. 1 shows body 100 as though it is on a surface of isolation regions 102. However, as shown in FIG. 2, body 100 may also be buried in dielectric or covered with a pad film for further processing.

Figure 3:
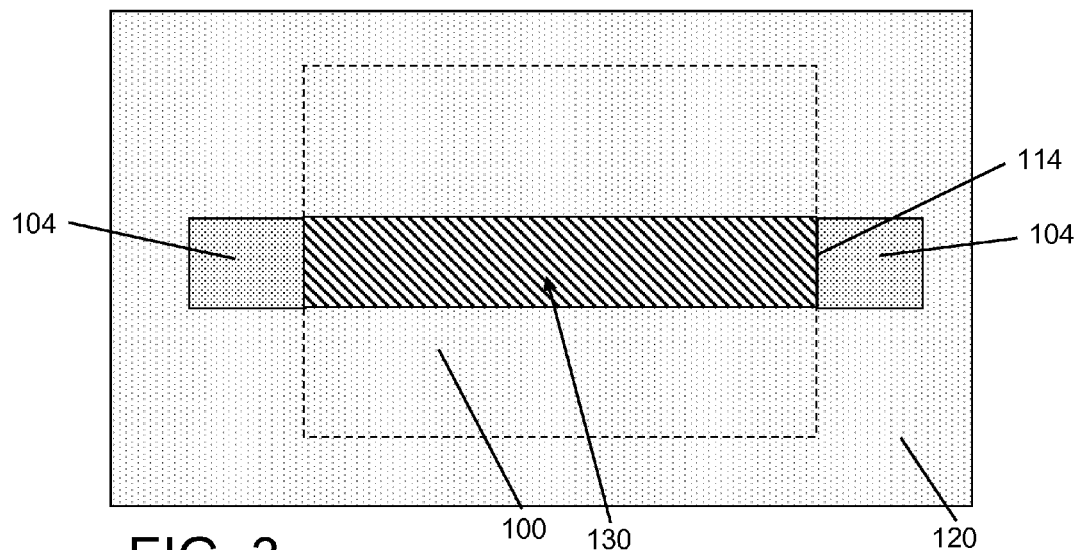
Figure 4:
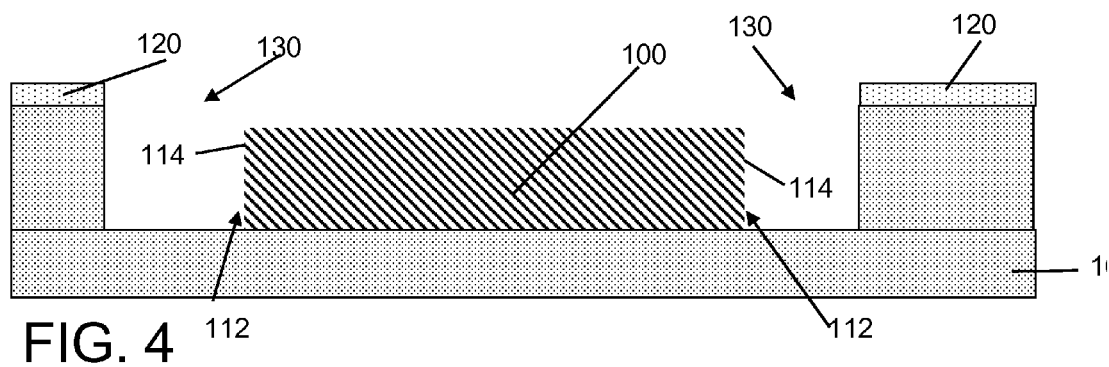
Figure 5:
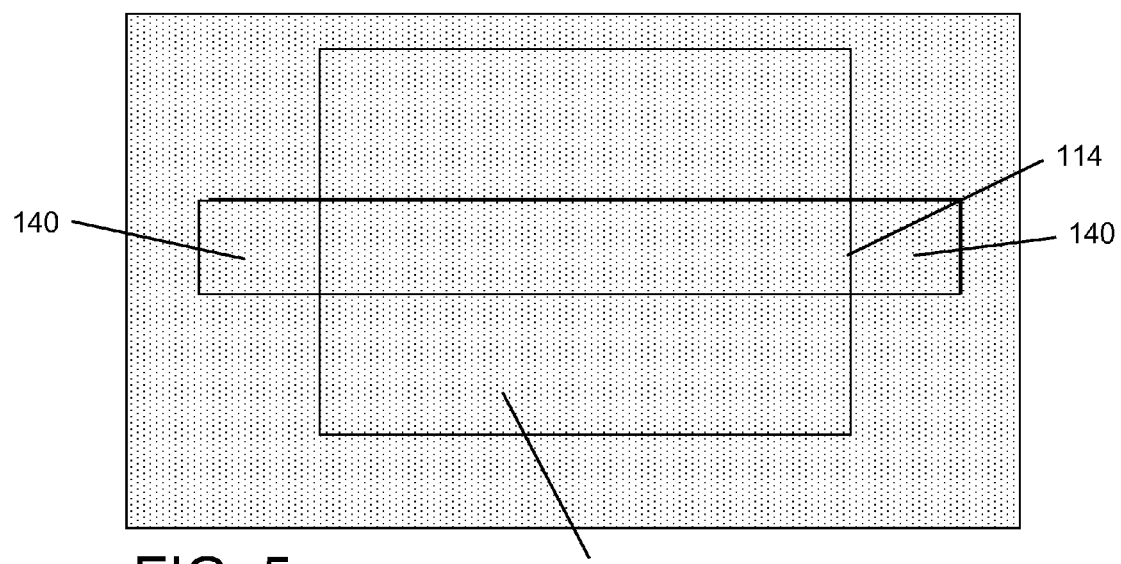
Figure 6:
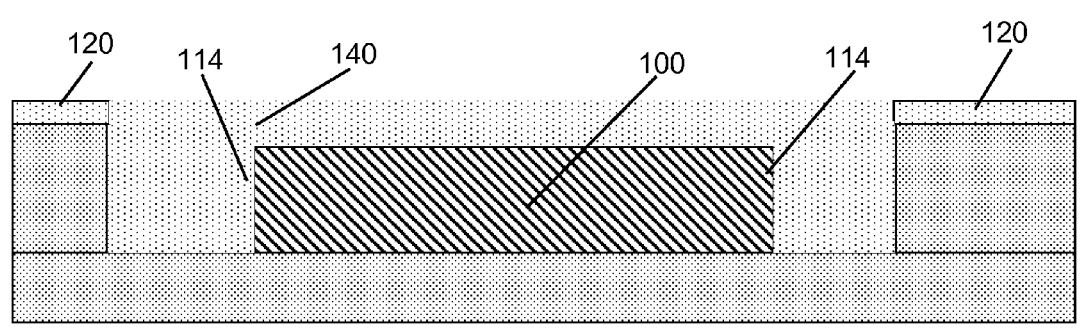
Figure 7:
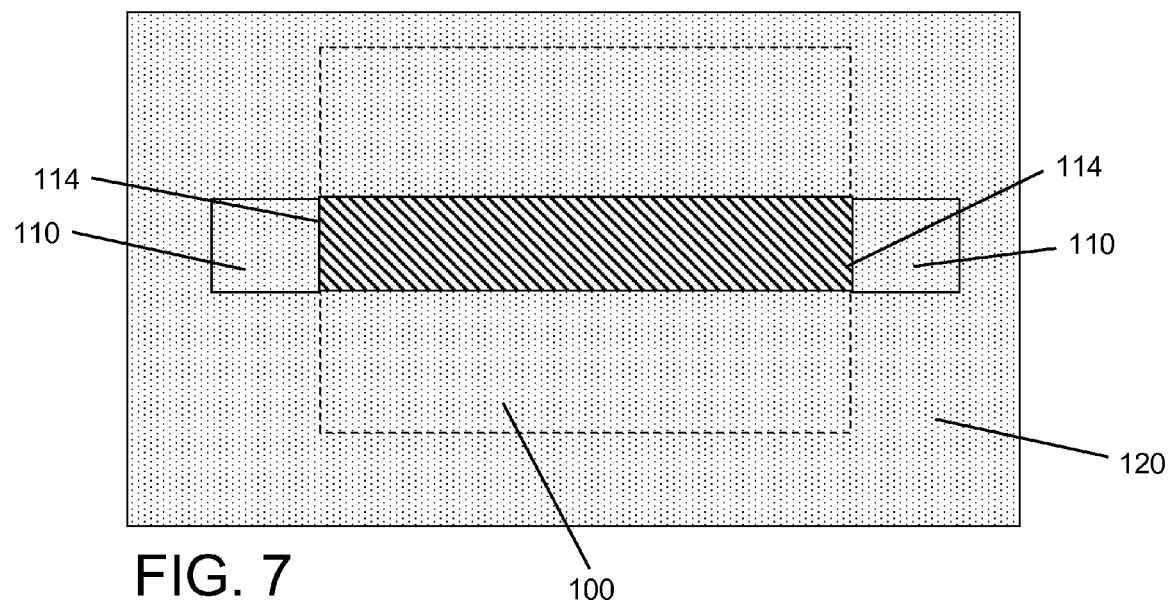
Figure 8:
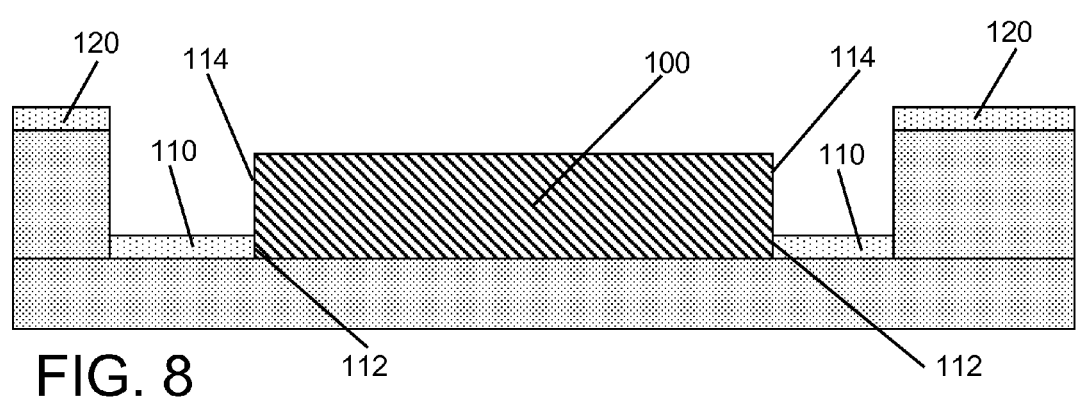

Next, as shown in FIGS. 3-8, a sacrificial layer 110 (FIGS. 7-8) that contacts at least a portion 112 (FIGS. 7-8) of a sidewall 114 (FIGS. 7-8) of body 100 is formed. In one embodiment, this step includes, as shown in FIGS. 3-4, forming a hardmask 120 over body 100. Hardmask 120 may include any now known or later developed hardmask material such as silicon oxide and silicon nitride. Next, as also shown in FIGS. 3-4, an opening 130 is formed to body 100 and along at least a portion 112 (FIG. 4) of sidewall 114 using hardmask 120. Opening 130 may be formed by patterning an etching hardmask 120, and one or more etching steps to remove isolation regions 102 along sidewall 114. For example, a Damascene opening of hardmask 130 may be carried out to a surface of body 100, followed by an isolation region 102 etch, stopping on buried insulator layer 104. As shown in FIGS. 5-6, opening 130 is filled with a sacrificial layer material 140. Sacrificial layer material 140 may include, for example, silicon nitride. FIGS. 7-8 show recessing sacrificial layer material 140 adjacent to sidewall 114 of body 100, leaving only sacrificial layer 110 that contacts at least a portion 112 of sidewall 114.

Figure 9:
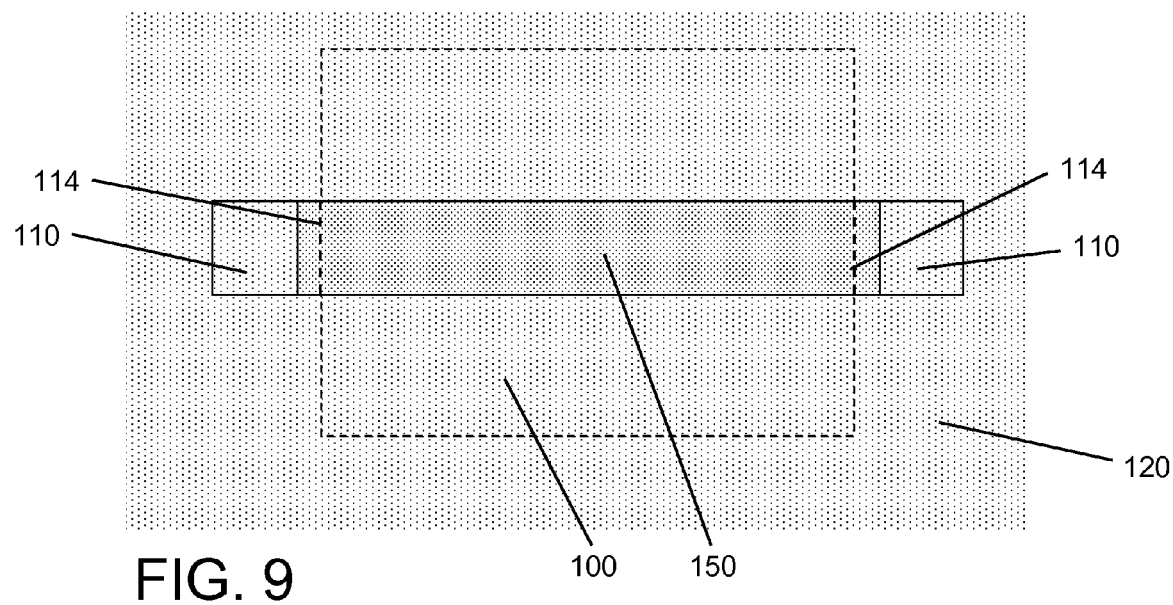
Figure 10:
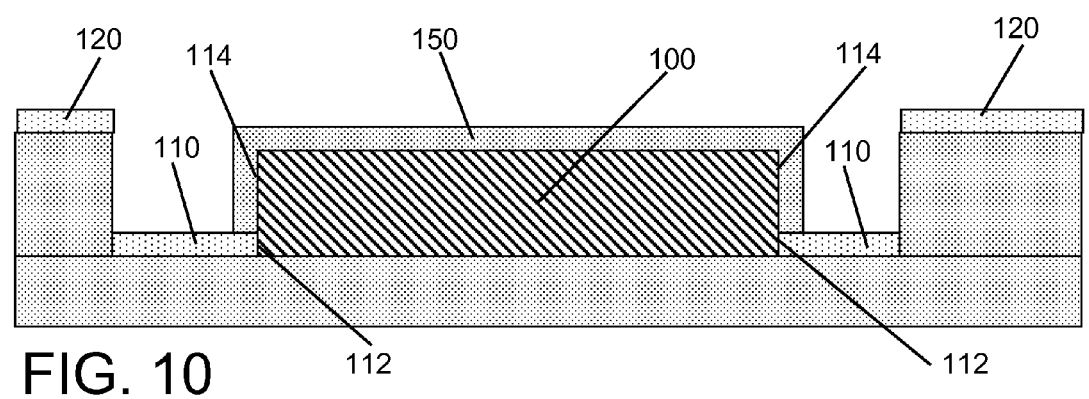

FIGS. 9-10 show forming a dielectric layer 150 about body 100 except at the at least a portion 112, which is covered by sacrificial layer 110. Dielectric layer 150 may include, for example, silicon oxide, which may be epitaxial grown from body 100, or any other high dielectric constant material.

Figure 11:
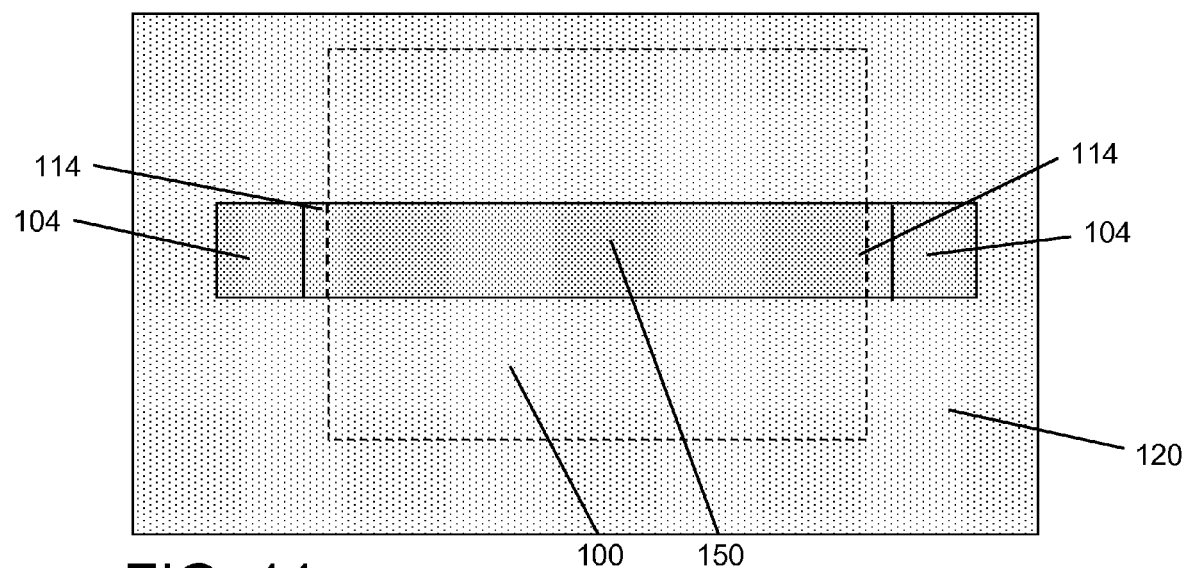
Figure 12:
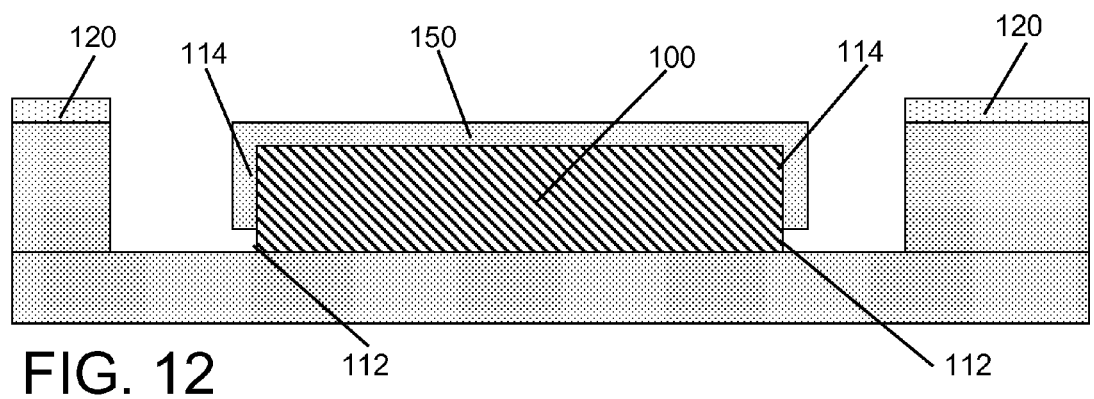

FIGS. 11-12 show removing sacrificial layer 110, e.g., by etching to buried insulator layer 104, thus exposing at least portion 112 of sidewall 114.

Figure 13:
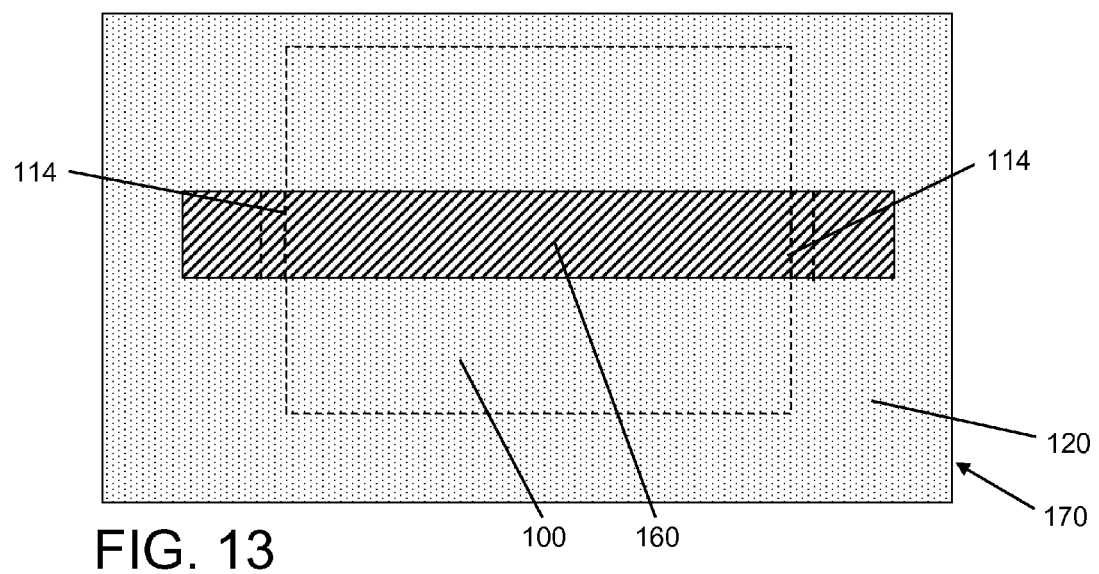
Figure 14:
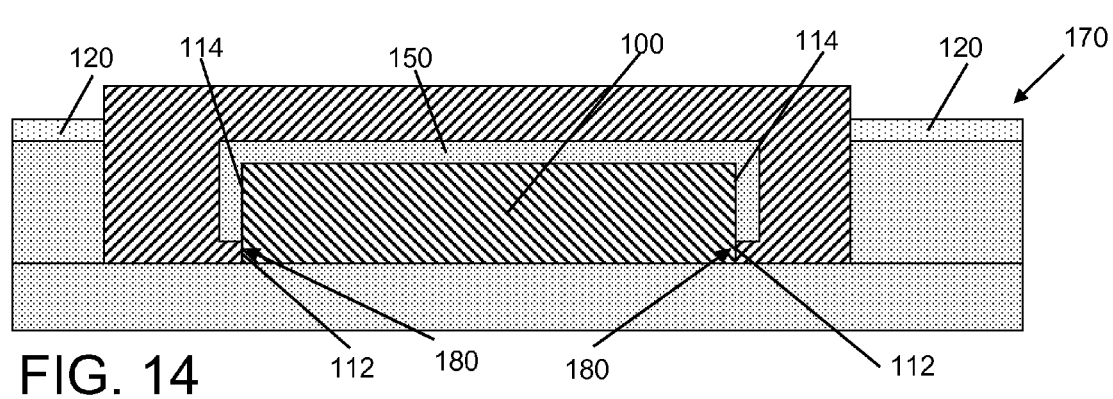

FIGS. 13-14 show forming a gate 160 about body 100 (and dielectric layer 150) such that gate 160 directly contacts at least portion 112 of sidewall 114 of body 100. In other words, a self-aligned gate contact 180 to body 100 is formed by forming gate 160 about body 100 such that gate 160 contacts sidewall 114 body contact region, i.e., at least a portion 112. Gate 160 may include a semiconductor material such as polysilicon (doped or undoped). In this fashion, field effect action is implemented where dielectric layer 150, acting as a gate dielectric exists, and direct contact action is implemented where gate 160 directly contacts body 100. This structure is useful for low voltage for DTCMOS devices. In particular, when gate 160 is turned on, it also turns on body 100 at the same time because of the direct contact, which lowers the threshold voltage of resulting transistor 170 (FIGS. 13-14) and makes transistor 170 turn on quickly.

As also shown in FIGS. 13-14, transistor 170 includes gate 160, body 100, and dielectric layer 150 extending over body 100 to insulate gate 160 from body 100 along an entire surface of body 100 except along (at least a) portion 112 of at least a sidewall 114 of body 100. As described above, in one embodiment, transistor 170 may be a dynamic threshold complementary metal-oxide semiconductor (DTCMOS) device.

The structures and methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of forming a contact between a gate and a body thereof, the method comprising:
   providing the body having an outside, wherein the providing includes providing the body between isolation regions;
   forming a sacrificial layer that contacts a portion of a vertical outer sidewall of the body, the forming of the sacrificial layer including:
   forming a hardmask over the body;
   forming an opening to the body and along the vertical outer sidewall of the body using the hardmask;
   filling the opening with a sacrificial layer material; and
   recessing the sacrificial layer material adjacent to the vertical outer sidewall of the body, leaving only the sacrificial layer contacting a portion of the vertical outer sidewall that is to be contacted by the gate;
   forming a dielectric layer around the outside of the body without directly contacting the portion of the vertical outer sidewall that previously contacted the sacrificial layer;
   removing all of the sacrificial layer in one or more steps; and
   forming the gate around the outside of the body such that the gate contacts the portion of the vertical outer sidewall of the body formerly covered by the sacrificial layer.

2. The method of claim 1, wherein the gate includes a semiconductor material.

3. The method of claim 2, wherein the semiconductor material includes polysilicon.

4. The method of claim 1, wherein the dielectric layer includes silicon oxide.

5. The method of claim 1, wherein the sacrificial layer includes silicon nitride.

6. The method of claim 1, wherein the hardmask includes silicon oxide and silicon nitride.

* * * * *